US010965270B2

(12) United States Patent
Aida et al.

(10) Patent No.: US 10,965,270 B2
(45) Date of Patent: Mar. 30, 2021

(54) PIEZOELECTRIC THIN FILM AND PIEZOELECTRIC VIBRATOR

(71) Applicant: Murata Manufacturing Co., Ltd., Nagaokakyo (JP)

(72) Inventors: Yasuhiro Aida, Nagaokakyo (JP); Keiichi Umeda, Nagaokakyo (JP)

(73) Assignee: MURATA MANUFACTURING CO., LTD., Nagaokakyo (JP)

(*) Notice: Subject to any disclaimer, the term of this patent is extended or adjusted under 35 U.S.C. 154(b) by 469 days.

(21) Appl. No.: 15/632,760

(22) Filed: Jun. 26, 2017

(65) Prior Publication Data

US 2017/0294894 A1 Oct. 12, 2017

Related U.S. Application Data

(63) Continuation of application No. PCT/JP2016/050092, filed on Jan. 5, 2016.

(30) Foreign Application Priority Data

Jan. 6, 2015 (JP) .............................. JP2015-001098

(51) Int. Cl.
*H03H 9/17* (2006.01)
*C23C 14/06* (2006.01)
*H03H 9/02* (2006.01)
*H03H 9/24* (2006.01)
*H03H 9/05* (2006.01)
(Continued)

(52) U.S. Cl.
CPC .............. *H03H 9/172* (2013.01); *C23C 14/06* (2013.01); *C23C 14/0617* (2013.01); *H03H 3/02* (2013.01); *H03H 9/02448* (2013.01); *H03H 9/0595* (2013.01); *H03H 9/2489* (2013.01); *H03H 9/564* (2013.01); *H03H 9/02031* (2013.01); *H03H 2003/027* (2013.01); *H03H 2003/0407* (2013.01); *H03H 2003/0435* (2013.01);
(Continued)

(58) Field of Classification Search
CPC . H03H 9/172; H03H 9/02; H03H 3/02; C23C 13/06; C23C 14/06
USPC ....................................................... 333/187
See application file for complete search history.

(56) References Cited

U.S. PATENT DOCUMENTS 7,477,001 B2   1/2009 Sato
9,087,979 B2   7/2015 Yokoyama et al.
(Continued)

FOREIGN PATENT DOCUMENTS

JP   2006-270506 A   10/2006
JP   2009-10926 A    1/2009
(Continued)

OTHER PUBLICATIONS

Dubois et al., "Stress and piezoelectric properties of aluminum nitride thin films deposited onto metal electrodes by pulsed direct current reactive sputtering," Journal of Applied Physics, vol. 89(11), Jun. 2001, pp. 6389-6395.
(Continued)

*Primary Examiner* — Samuel S Outten
(74) *Attorney, Agent, or Firm* — Arent Fox LLP (57) ABSTRACT

A piezoelectric film that includes crystalline AlN; at least one first element partially replacing Al in the crystalline AlN; and a second element doping the crystalline AlN and which has an ionic radius smaller than that of the first element and larger than that of Al.

10 Claims, 10 Drawing Sheets

(51) Int. Cl.
- *H03H 3/02* (2006.01)
- *H03H 9/56* (2006.01)
- *H03H 9/15* (2006.01)
- *H03H 3/04* (2006.01)

(52) U.S. Cl.
CPC .............. *H03H 2009/0248* (2013.01); *H03H 2009/155* (2013.01)

(56) References Cited

U.S. PATENT DOCUMENTS

| | | |
|---|---|---|
| 2006/0214539 A1 | 9/2006 | Sato |
| 2008/0296529 A1 | 12/2008 | Akiyama et al. |
| 2013/0241673 A1 | 9/2013 | Yokoyama et al. |
| 2014/0125432 A1* | 5/2014 | Stephanou ............... H03H 3/02 333/188 |
| 2014/0167560 A1* | 6/2014 | Onda ................. H03H 9/02015 310/311 |

FOREIGN PATENT DOCUMENTS

| | | |
|---|---|---|
| JP | 2013-148562 A | 8/2013 |
| JP | 2013-219743 A | 10/2013 |

OTHER PUBLICATIONS

International Search Report issued in International Application No. PCT/JP2016/050092, dated Mar. 15, 2016.

Written Opinion of the International Searching Authority issued in International Application No. PCT/JP2016/050092, dated Mar. 15, 2016.

* cited by examiner

| Ion | Valence | Coordination number | Ionic radius |
|---|---|---|---|
| Al | 3 | IV | 0.39 |
| | | V | 0.48 |
| | | VI | 0.535 |
| N | -3 | IV | 1.46 |
| | 3 | VI | 0.16 |
| | 5 | III | -0.104 |
| | | VI | 0.13 |

| Ion | Valence | Coordination number | Ionic radius |
|---|---|---|---|
| Ca | 2 | VI | 1 |
| | | VII | 1.06 |
| | | VIII | 1.12 |
| | | IX | 1.18 |
| | | X | 1.23 |
| | | XII | 1.34 |
| Hf | 4 | IV | 0.58 |
| | | VI | 0.71 |
| | | VII | 0.76 |
| | | VIII | 0.83 |
| Mg | 2 | IV | 0.57 |
| | | V | 0.66 |
| | | VI | 0.72 |
| | | VIII | 0.89 |
| Nb | 3 | VI | 0.72 |
| | 4 | VI | 0.68 |
| | | VIII | 0.79 |
| | 5 | IV | 0.48 |
| | | VI | 0.64 |
| | | VII | 0.69 |
| | | VIII | 0.74 |
| Sc | 3 | VI | 0.745 |
| | | VIII | 0.87 |
| Sr | 2 | VI | 1.18 |
| | | VII | 1.21 |
| | | VIII | 1.26 |
| | | IX | 1.31 |
| | | X | 1.36 |
| | | XII | 1.44 |
| V | 2 | VI | 0.79 |
| | 3 | VI | 0.64 |
| | 4 | V | 0.53 |
| | | VI | 0.58 |
| | | VIII | 0.72 |
| | 5 | IV | 0.355 |
| | | V | 0.46 |
| | | VI | 0.54 |
| Y | 3 | VI | 0.9 |
| | | VII | 0.96 |
| | | VIII | 1.019 |
| | | IX | 1.075 |
| Zn | 2 | IV | 0.6 |
| | | V | 0.68 |
| | | VI | 0.74 |
| | | VIII | 0.9 |
| Zr | 4 | IV | 0.59 |
| | | V | 0.66 |
| | | VI | 0.72 |
| | | VII | 0.78 |
| | | VIII | 0.84 |
| | | IX | 0.89 |

FIG. 5

| Ion | Valence | Coordination number | Ionic radius |
|---|---|---|---|
| Cr | 2 | VI | 0.8 |
|  |  |  | 0.73 |
|  | 3 | VI | 0.615 |
|  | 4 | IV | 0.41 |
|  |  | VI | 0.55 |
|  | 5 | IV | 0.345 |
|  |  | VI | 0.49 |
|  |  | VIII | 0.57 |
|  | 6 | IV | 0.26 |
|  |  | VI | 0.44 |
| Fe | 2 | IV | 0.63 |
|  |  | IVSQ | 0.64 |
|  |  | VI | 0.61 |
|  |  |  | 0.78 |
|  |  | VIII | 0.92 |
|  | 3 | IV | 0.49 |
|  |  | V | 0.58 |
|  |  | VI | 0.55 |
|  |  |  | 0.645 |
|  |  | VIII | 0.78 |
|  | 4 | VI | 0.585 |
|  | 6 | IV | 0.25 |
| Ni | 2 | IV | 0.55 |
|  |  | IVSQ | 0.49 |
|  |  | V | 0.63 |
|  |  | VI | 0.69 |
|  | 3 | VI | 0.6 |
|  |  |  | 0.56 |
|  | 4 | VI | 0.48 |
| Ta | 3 | VI | 0.72 |
|  | 4 | VI | 0.68 |
|  | 5 | VI | 0.64 |
|  |  | VII | 0.69 |
|  |  | VIII | 0.74 |
| Ti | 2 | VI | 0.86 |
|  | 3 | VI | 0.67 |
|  | 4 | IV | 0.42 |
|  |  | V | 0.51 |
|  |  | VI | 0.605 |
|  |  | VIII | 0.74 |
| W | 4 | VI | 0.66 |
|  | 5 | VI | 0.62 |
|  | 6 | IV | 0.42 |
|  |  | V | 0.51 |
|  |  | VI | 0.6 |

FIG. 6

| | Sc composition ratio | Second element | Second element content (at%) | Valence of second element | Coordination number of second element | Stress (MPa) | Piezoelectric constant $d_{33}$ (pC/N) |
|---|---|---|---|---|---|---|---|
| Comparative Example 1 | 0.03 | - | - | - | - | -200 | 9.0 |
| Comparative Example 2 | 0.05 | - | - | - | - | -225 | 11.0 |
| Comparative Example 3 | 0.10 | - | - | - | - | -403 | 12.0 |
| Comparative Example 4 | 0.20 | - | - | - | - | -560 | 13.0 |
| Comparative Example 5 | 0.30 | - | - | - | - | -802 | 15.0 |
| Comparative Example 6 | 0.40 | - | - | - | - | -1111 | 22.0 |
| Comparative Example 7 | 0.50 | - | - | - | - | -1248 | 18.0 |
| Comparative Example 8 | 0.55 | - | - | - | - | -1505 | 0.0 |
| Example 1 | 0.03 | W | 0.50 | 4+ | 6 | -155 | 9.2 |
| Example 2 | 0.05 | W | 0.50 | 4+ | 6 | -176 | 11.3 |
| Example 3 | 0.10 | W | 0.50 | 4+ | 6 | -342 | 12.2 |
| Example 4 | 0.20 | W | 0.50 | 4+ | 6 | -520 | 13.5 |
| Example 5 | 0.30 | W | 0.50 | 4+ | 6 | -765 | 15.4 |
| Example 6 | 0.40 | W | 0.50 | 4+ | 6 | -999 | 22.2 |
| Example 7 | 0.50 | W | 0.50 | 4+ | 6 | -1108 | 18.1 |
| Comparative Example 9 | 0.55 | W | 0.50 | 4+ | 6 | -1342 | 0.0 |
| Example 8 | 0.40 | Zr | 0.50 | 4+ | 6 | -985 | 22.2 |
| Example 9 | 0.40 | Ta | 0.50 | 3+ | 6 | -950 | 23.0 |
| Example 10 | 0.40 | Ti | 0.50 | 3+ | 6 | -947 | 23.1 |
| Example 11 | 0.40 | Cr | 0.50 | 3+ | 6 | -960 | 22.4 |
| Example 12 | 0.40 | Ni | 0.50 | 3+ | 6 | -951 | 23.4 |
| Example 13 | 0.40 | Fe | 0.50 | 3+ | 6 | -942 | 23.6 |
| Example 14 | 0.40 | Fe | 0.005 | 3+ | 4 | -1090 | 24.0 |
| Example 15 | 0.40 | Fe | 0.01 | 3+ | 4 | -1074 | 24.2 |
| Example 16 | 0.40 | Fe | 0.10 | 3+ | 4 | -1001 | 24.3 |
| Example 17 | 0.40 | Fe | 0.20 | 3+ | 4 | -980 | 24.5 |
| Example 18 | 0.40 | Fe | 0.50 | 3+ | 4 | -900 | 24.5 |
| Example 19 | 0.40 | Fe | 0.70 | 3+ | 4 | -754 | 24.2 |
| Example 20 | 0.40 | Fe | 1.00 | 3+ | 4 | -642 | 24.1 |
| Example 21 | 0.40 | Fe | 1.10 | 3+ | 4 | -601 | 16.2 |

| | First element | | Second element | Second element content (at%) | Valence of second element | Coordination number of second element | Stress (MPa) | Piezoelectric constant $d_{33}$ (pC/N) |
|---|---|---|---|---|---|---|---|---|
| | Mg composition ratio | Nb composition ratio | | | | | | |
| Comparative Example 2-1 | 0.2 | 0.2 | Absent | 0 | — | — | -750.6 | 18.2 |
| Experimental Example 2-2 | 0.2 | 0.2 | Fe | 0.005 | 3+ | 4 | -719.4 | 18.0 |
| Experimental Example 2-3 | 0.2 | 0.2 | Fe | 0.01 | 3+ | 4 | -708.8 | 18.1 |
| Experimental Example 2-4 | 0.2 | 0.2 | Fe | 0.10 | 3+ | 4 | -660.7 | 18.0 |
| Experimental Example 2-5 | 0.2 | 0.2 | Fe | 0.20 | 3+ | 4 | -646.8 | 17.9 |
| Experimental Example 2-6 | 0.2 | 0.2 | Fe | 0.50 | 3+ | 4 | -605.0 | 17.9 |
| Experimental Example 2-7 | 0.2 | 0.2 | Fe | 0.70 | 3+ | 4 | -506.0 | 18.1 |
| Experimental Example 2-8 | 0.2 | 0.2 | Fe | 1.00 | 3+ | 4 | -423.7 | 17.6 |
| Experimental Example 2-8 | 0.2 | 0.2 | Fe | 1.10 | 3+ | 4 | -396.7 | 10.5 |

FIG. 10

| | First element | | Second element | Second element content (at%) | Valence of second element | Coordination number of second element | Stress (MPa) | Piezoelectric constant $d_{33}$ (pC/N) |
|---|---|---|---|---|---|---|---|---|
| | Mg composition ratio | Hf composition ratio | | | | | | |
| Comparative Example 3-1 | 0.25 | 0.25 | Absent | 0 | — | — | −1206.6 | 19.0 |
| Experimental Example 3-1 | 0.25 | 0.25 | Fe | 0.005 | 3+ | 4 | −1144.5 | 19.2 |
| Experimental Example 3-2 | 0.25 | 0.25 | Fe | 0.01 | 3+ | 4 | −1117.0 | 19.1 |
| Experimental Example 3-3 | 0.25 | 0.25 | Fe | 0.10 | 3+ | 4 | −1081.1 | 18.9 |
| Experimental Example 3-4 | 0.25 | 0.25 | Fe | 0.20 | 3+ | 4 | −960.4 | 19.0 |
| Experimental Example 3-5 | 0.25 | 0.25 | Fe | 0.50 | 3+ | 4 | −891.0 | 18.6 |
| Experimental Example 3-6 | 0.25 | 0.25 | Fe | 0.70 | 3+ | 4 | −754.0 | 18.8 |
| Experimental Example 3-7 | 0.25 | 0.25 | Fe | 1.00 | 3+ | 4 | −706.2 | 19.0 |
| Experimental Example 3-8 | 0.25 | 0.25 | Fe | 1.10 | 3+ | 4 | −589.0 | 13.2 |

PIEZOELECTRIC THIN FILM AND PIEZOELECTRIC VIBRATOR

CROSS REFERENCE TO RELATED APPLICATIONS

The present application is a continuation of International application No. PCT/JP2016/050092, filed Jan. 5, 2016, which claims priority to Japanese Patent Application No. 2015-001098, filed Jan. 6, 2015, the entire contents of each of which are incorporated herein by reference.

FIELD OF THE INVENTION

The present invention relates to a piezoelectric thin film and a piezoelectric vibrator.

BACKGROUND OF THE INVENTION

Piezoelectric vibrators that use micro electro mechanical systems (MEMS) are known. For example, Patent Document 1 discloses that an aluminum nitride (AlN) thin film doped with scandium (Sc) (a scandium-doped aluminum nitride thin film (ScAlN thin film)) is used as a piezoelectric thin film to form a piezoelectric vibrator with improved piezoelectric properties.

Patent Document 1: Japanese Patent Application Laid-Open No. 2009-010926
Patent Document 2: Japanese Patent Application Laid-Open No. 2013-219743
Patent Document 3: Japanese Patent Application Laid-Open No. 2006-270506
Non-Patent Document 1: Mark-Alexandre Dubois et al., "Stress and piezoelectric properties of aluminum nitride thin films deposited onto metal electrodes by pulsed direct current reactive sputtering," JOURNAL OF APPLIED PHYSICS, Volume 89, No. 11, Jun. 1, 2001, pp. 6389-6395

SUMMARY OF THE INVENTION

It is generally known that stress, specifically, compressive stress occurs in ScAlN films that are deposited on a substrate such as silicon (Si) by sputtering. Such stress is not good because it can lead to mechanical destruction, such as cracking, of piezoelectric thin films. The occurrence of stress may be attributable to partial replacement of aluminum (Al) atoms in crystalline AlN by scandium (Sc) atoms with an ionic radius larger than that of Al atoms. This can cause expansion and distortion of the crystal lattice.

In the process of depositing ScAlN, increasing the pressure of a mixed gas of argon (Ar) and nitrogen ($N_2$) to a level higher than normal can reduce the sputtered particle implantation effect on the ScAlN film and thus reduce the stress in the ScAlN film. It is known, however, that the increase in the gas pressure can reduce the kinetic energy of the sputtered particles and thus degrade the crystallinity and piezoelectric properties of the ScAlN film.

Conventionally, it is therefore difficult to achieve both a reduction in the stress and an improvement in the piezoelectric properties.

It is an object of the present invention to provide a piezoelectric thin film and a piezoelectric vibrator that can each be produced with a satisfactory level of piezoelectric properties and a lower level of stress.

An aspect of the present invention is directed to a piezoelectric thin film that includes crystalline AlN; at least one first element which partially replaces Al in the crystalline AlN; and a second element with which the crystalline AlN is doped and which has an ionic radius smaller than the ionic radius of the first element and larger than the ionic radius of Al.

The present invention allows a piezoelectric thin film and a piezoelectric vibrator to be produced with a satisfactory level of piezoelectric properties and a lower level of stress.

DETAILED DESCRIPTION OF PREFERRED EMBODIMENTS OF THE INVENTION

Figure 1:
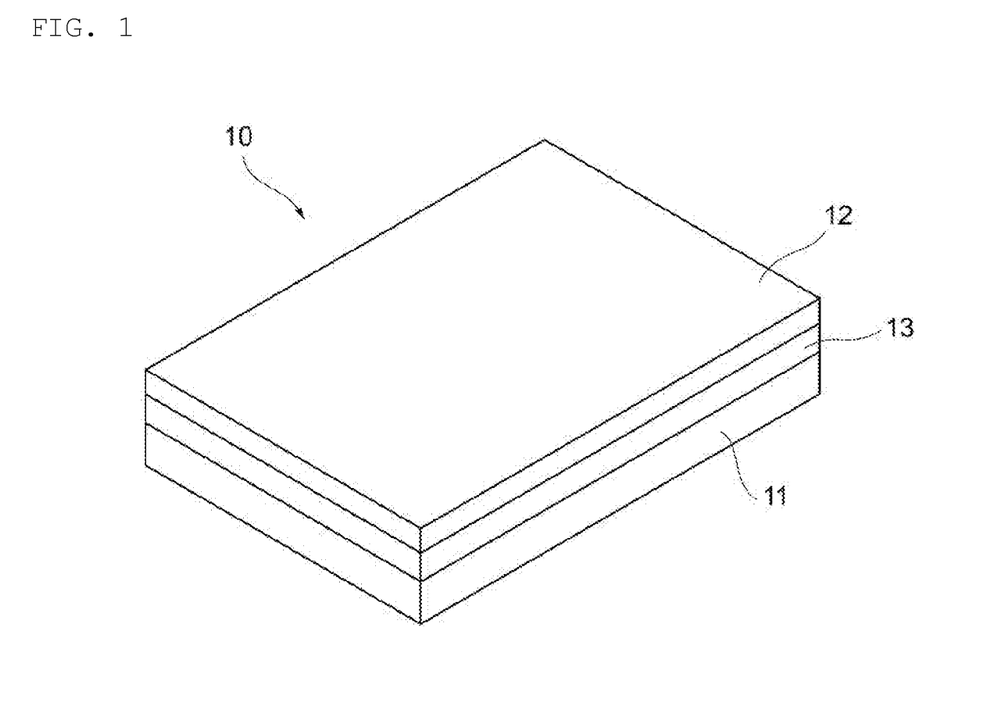
FIG. 1 is a perspective view schematically illustrating the appearance of a piezoelectric vibration device according to an embodiment.

Hereinafter, an embodiment of the present invention will be described with reference to the attached drawings. FIG. 1 is a perspective view schematically illustrating the appearance of a piezoelectric vibration device 10 according to an embodiment.

The piezoelectric vibration device 10 includes a lower substrate 11, an upper substrate 12 that is so disposed that a vibration space is formed between the lower and upper substrates 11 and 12, and a piezoelectric vibrator 13 disposed between the lower and upper substrates 11 and 12. The piezoelectric vibrator 13 is a MEMS vibrator produced using MEMS technology. The piezoelectric vibration device 10 can functions as, for example, a timing device when incorporated in an electronic device such as a smart phone.

Figure 2:
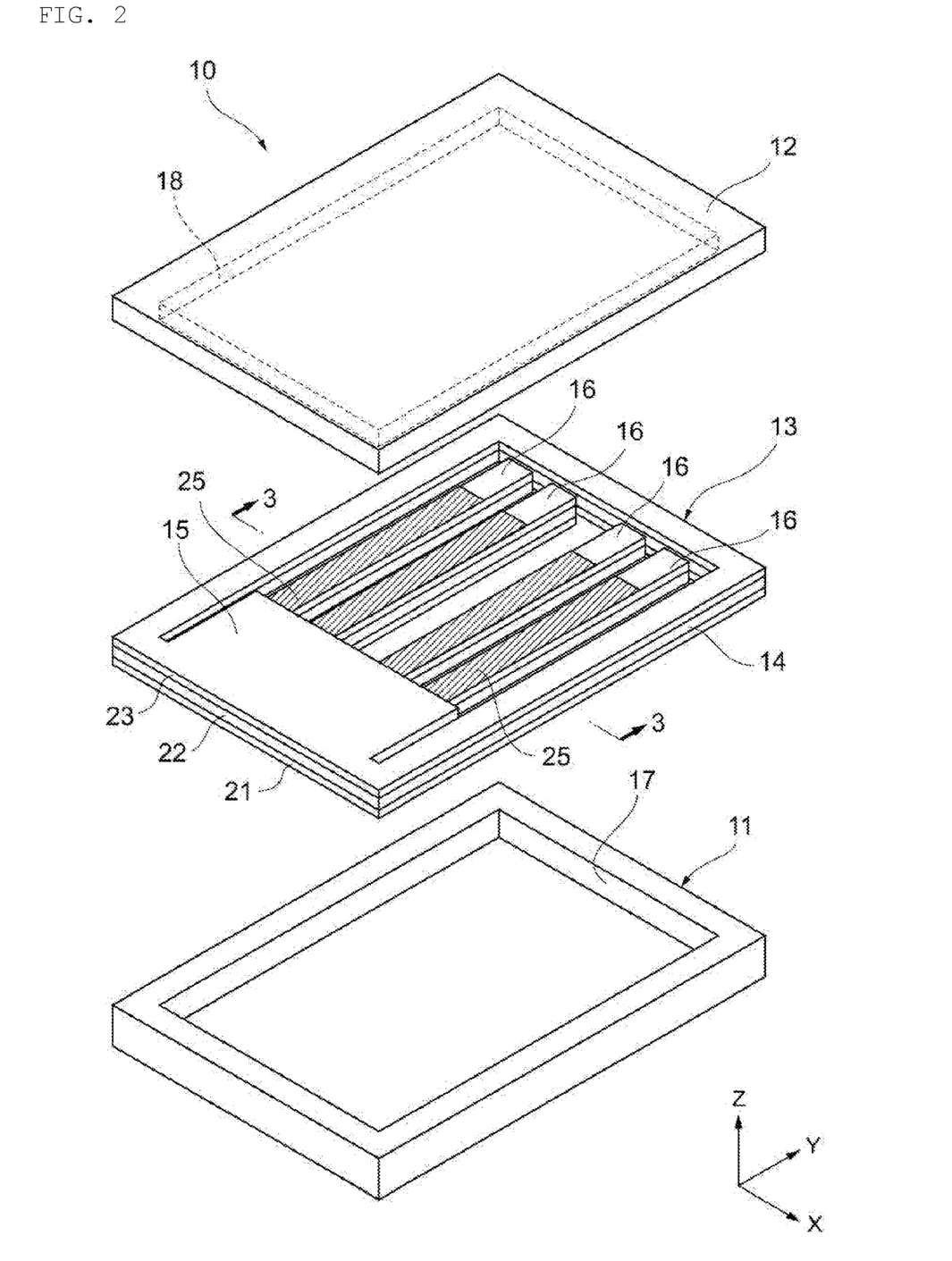
FIG. 2 is an exploded perspective view schematically illustrating the structure of the piezoelectric vibration device according to an embodiment.

FIG. 2 is an exploded perspective view schematically illustrating the structure of the piezoelectric vibration device 10 according to an embodiment. As illustrated in FIG. 2, the piezoelectric vibrator 13 includes a supporting frame 14 extending in the form of a rectangular frame along the XY plane of the rectangular coordinate system in FIG. 2, a base 15 extending in the form of a flat sheet from one end of the supporting frame 14 to the inside of the supporting frame 14 along the XY plane, and a plurality of vibration arms 16 each extending from the fixed end, which is connected to one end of the base 15, to the free end along the XY plane. In this embodiment, four vibration arms 16 extend parallel to the Y axis. It will be understood that the number of vibration arms 16 is not limited to four and may be, for example, three or any number greater than three.

Figure 3:
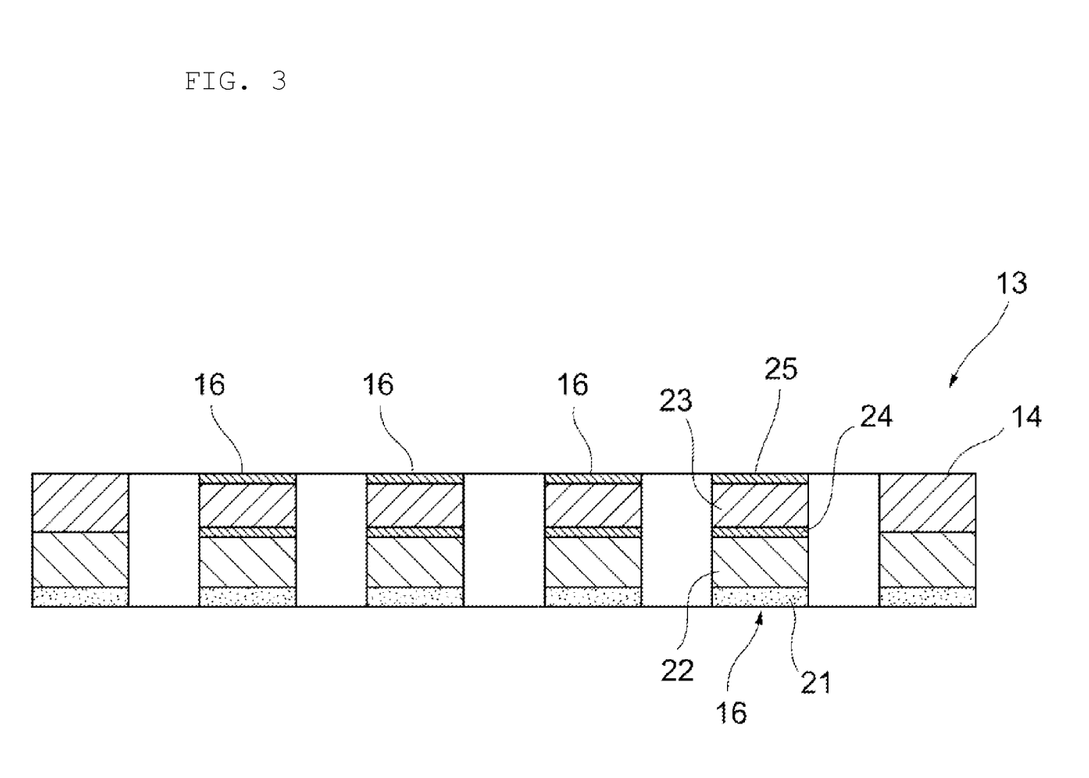
FIG. 3 is a schematic cross-sectional view of a piezoelectric vibrator along the line 3-3 in FIG. 2.

FIG. 3 is a schematic cross-sectional view of the piezoelectric vibrator 13 along the line 3-3 in FIG. 2.

Also referring to FIG. 3, the lower substrate 11 in the piezoelectric vibration device 10 according to an embodiment has a recess 17 that is formed on the upper surface and extends in a flat manner along the XY plane. The recess 17, which is, for example, in the form of a flat rectangular parallelepiped, forms part of the vibration space for the vibration arms 16. On the other hand, the upper substrate 12, which extends in the form of a flat sheet along the XY plane, has a recess 18 formed on the lower surface. The recess 18, which is, for example, in the form of a flat rectangular parallelepiped, forms part of the vibration space for the vibration arms 16.

In the piezoelectric vibration device 10, the supporting frame 14 of the piezoelectric vibrator 13 is mounted on the periphery of the upper surface of the lower substrate 11, which is defined outside the recess 17, and the periphery of the lower surface of the upper substrate 12, which is defined outside the recess 18, is mounted on the supporting frame 14 of the piezoelectric vibrator 13. In this way, the piezoelectric vibrator 13 is held between the lower and upper substrates 11 and 12, so that the vibration space for the vibration arms 16 is formed by the lower and upper substrates 11 and 12 and the supporting frame 14 of the piezoelectric vibrator 13. The vibration space is kept air-tight and maintained in a vacuum state.

The lower and upper substrates 11 and 12 are both made of silicon (Si). In the piezoelectric vibrator 13, each vibration arm 16 includes a $SiO_2$ layer 21, a Si layer 22 disposed on the $SiO_2$ layer 21, a piezoelectric thin film 23 disposed on the Si layer 22, and lower and upper electrodes 24 and 25 that are formed on the lower and upper surfaces of the piezoelectric thin film 23 to sandwich the piezoelectric thin film 23. The $SiO_2$ layer 21 may also be formed on the upper or lower surface of the piezoelectric thin film 23.

The $SiO_2$ layer 21 includes a silicon oxide material with an appropriate composition represented by $Si_aO_b$ layer, wherein a and b are each an integer. The frequency-temperature coefficient of the piezoelectric vibrator 13 can be corrected by controlling the thickness of the $SiO_2$ layer 21. The Si layer 22 is made of an n-type Si semiconductor, which is a degenerate semiconductor and contains, for example, phosphorus (P), arsenic (As), antimony (Sb), or any other Group 15 element as an n-type dopant. In this embodiment, phosphorous (P) is used as an n-type dopant for the Si layer 22.

The lower and upper electrodes 24 and 25 each include, for example, a metal material such as molybdenum (Mo), ruthenium (Ru), platinum (Pt), titanium (Ti), chromium (Cr), aluminum (Al), copper (Cu), silver (Ag), or any alloy thereof. The lower and upper electrodes 24 and 25 are each connected to an AC power source (not shown) provided outside the piezoelectric vibration device 10. The connection is established using, for example, an electrode (not shown) formed on the upper surface of the upper substrate 12 and a through silicon via (TSV) (not shown) formed in the upper substrate 12.

The piezoelectric thin film 23 includes crystalline aluminum nitride (AlN) as a main component, at least one first element which partially replaces Al in the crystalline AlN, and a second element with which the crystalline AlN is doped and which has an ionic radius smaller than that of the first element and larger than that of aluminum (Al). For example, the piezoelectric thin film 23 may contain only a Group 3 element as the first element or may contain both a Group 2 element and a Group 4 element, both a Group 2 element and a Group 5 element, both a Group 12 element and a Group 4 element, or both a Group 12 element and a Group 5 element, as the first elements.

Specifically, for example, scandium (Sc) or yttrium (Y) is selected as the Group 3 element. For example, magnesium (Mg), calcium (Ca), or strontium (Sr) is selected as the Group 2 element. For example, titanium (Ti), zirconium (Zr), or hafnium (Hf) is selected as the Group 4 element. For example, vanadium (V) or niobium (Nb) is selected as the Group 5 element. For example, zinc (Zn) is selected as the Group 12 element.

Figure 4:
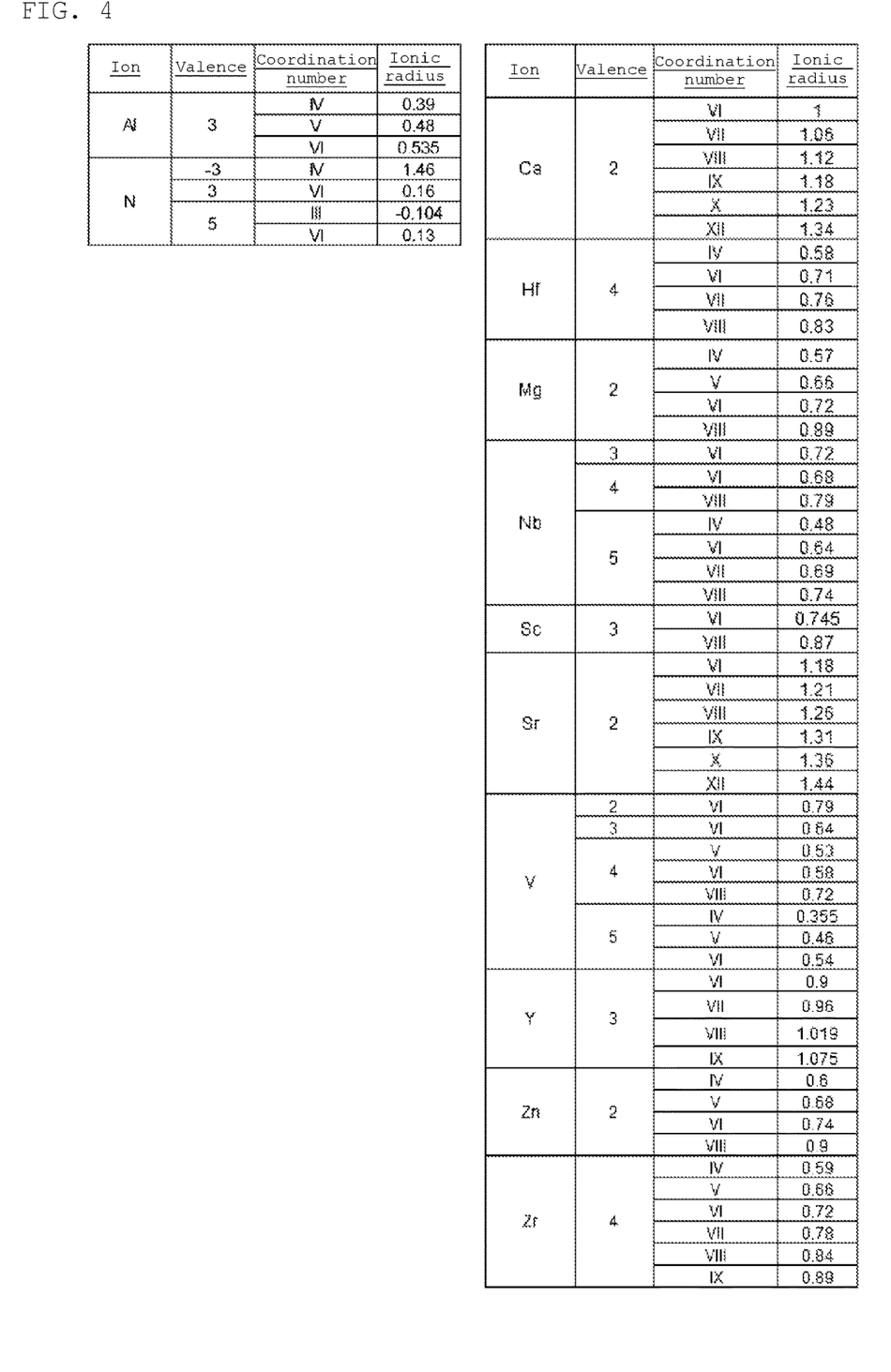
FIG. 4 is a table showing the ionic radius of each element.

FIG. 4 is a table showing the valence, coordination number, and ionic radius of each of the main component AlN (Al, N) and the first element (Sc, Y, Mg, Ca, Sr, Zr, Hf, V, Nb, Zn). As shown in this table, for example, Al in the crystalline AlN as the main component has an ionic radius of 0.39 picometers (pm), for example, when existing as a trivalent cation and having a coordination number of 4.

The ionic radius of each element for use as the first element is as shown in the table of FIG. 4.

The piezoelectric thin film 23 has a wurtzite structure with the c axis oriented substantially perpendicular to the Si layer 22. When a voltage is applied in the c axis direction across the lower and upper electrodes 24 and 25, the piezoelectric thin film 23 expands and contracts in a direction substantially perpendicular to the c axis.

According to the expansion and contraction, the vibration arm 16 bends and deforms in the z axis direction to allow its free end to shift toward the inner surfaces of the lower and upper substrates 11 and 12, so that the vibration arm 16 vibrates in an out-plane bending vibration mode.

Figure 5:
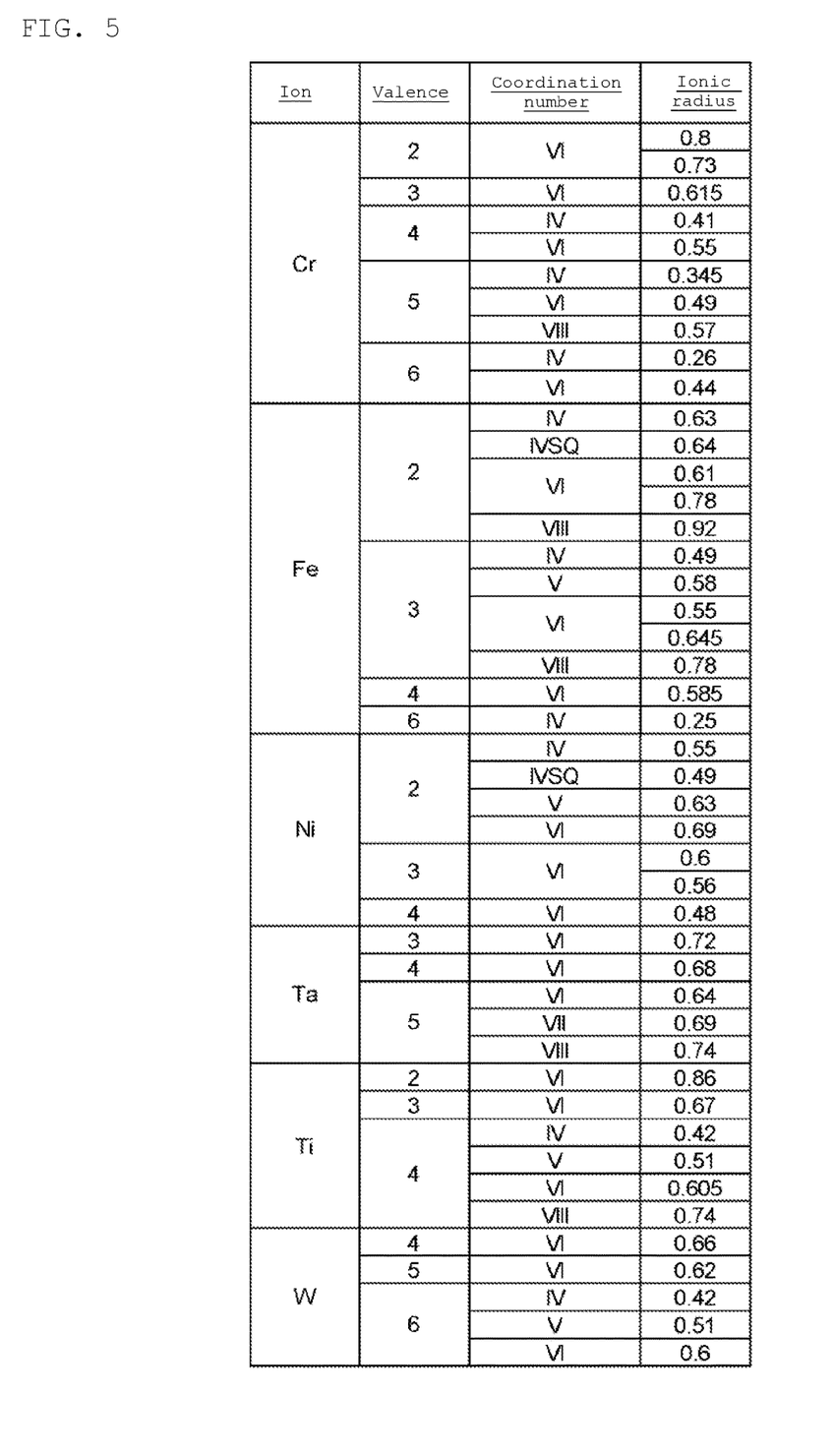
FIG. 5 is a table showing the ionic radius of each element.

As mentioned above, the second element has an ionic radius smaller than the ionic radius of the first element and larger than the ionic radius of aluminum (Al). In addition, as mentioned below, the second element preferably exists as a trivalent cation. In this embodiment, the second element may be, for example, at least one element selected from tungsten (W), zirconium (Zr), iron (Fe), tantalum (Ta), chromium (Cr), titanium (Ti), and nickel (Ni). FIG. 5 is a table showing the valence, coordination number, and ionic radius of each of the second elements. Note that those of Zr are shown in FIG. 4.

In this embodiment, Sc, a Group 3 element, is selected as the first element. In this case, the ratio of the number of Sc atoms to the total number of Al and Sc atoms (hereinafter also referred to as the "Sc composition ratio") in the piezoelectric thin film 23 is preferably set to 0.03 to 0.50. In addition, the percentage ratio of the number of atoms of the second element to the total number of Al and Sc atoms (hereinafter also referred to as the "content of the second element") in the piezoelectric thin film 23 is preferably set to 0.01 at % to 1.00 at %. A detailed description will be given later for these value ranges.

The inventor verified the effects of the present invention described above. For the verification, examples and comparative examples were carried out, in which piezoelectric thin films were formed, respectively, and then the stress in the piezoelectric thin films and the piezoelectric properties of the piezoelectric thin films were measured. The piezoelectric thin films were each formed on a 3-inch diameter Si substrate by RF magnetron sputtering of a 3-inch diameter alloy target with the specified composition. In this way, the piezoelectric thin films with the specified compositions were each formed with a thickness of 1.0 μm on the Si substrate. For the verification, for example, Sc was used as the first element, and W, Zr, Ta, Ti, Cr, Ni, or Fe was used as the second element.

Specifically, the composition of the target was adjusted depending on the composition of the piezoelectric thin film to be formed in each of the examples and the comparative examples. In the RF magnetron sputtering, the RF power was set to 300 W, and argon (Ar) and nitrogen (N2) gas flow rates in the chamber were set to 30 sccm and 15 sccm, respectively. In addition, the temperature of the Si substrate was set to 200° C., and the back pressure and the deposition pressure were set to $1.0 \times 10\text{-}4$ Pa and $1.0 \times 10\text{-}1$ Pa, respectively.

Measurements were taken of the stress (MPa) in each piezoelectric thin film formed under the above conditions and of the piezoelectric property (piezoelectric constant d33) (pC/N) of each piezoelectric thin film. The piezoelectric constant was measured by the Berlincourt method using a measurement system PM100 manufactured by Piezotest Pte Ltd. The composition of each piezoelectric thin film was analyzed on the basis of laser ablation inductively coupled plasma mass spectrometry (LA-ICP-MS). The valence and coordination number of the elements in each piezoelectric thin film were analyzed on the basis of X-ray absorption fine structure (XAFS) spectroscopy.

Figure 6:
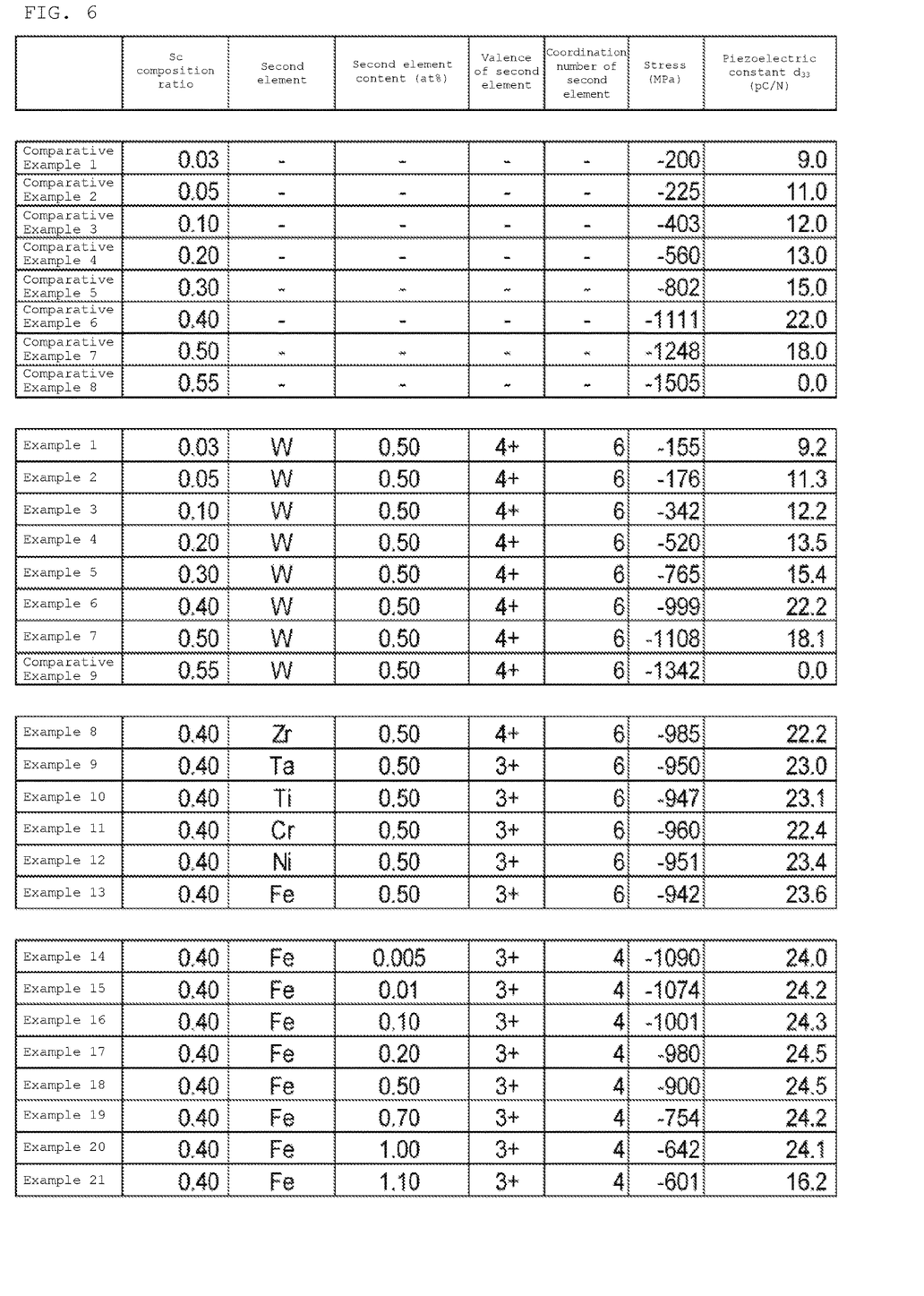
FIG. 6 is a table showing the results of verification of the effects of a first embodiment of the present invention.

FIG. 6 is a table showing the results of the verification of the effects of the present invention. In the table, the Sc composition ratio means, as mentioned above, the ratio of the number of Sc atoms to the total number of Al atoms and atoms of the first element in the piezoelectric thin film 23. The content means the ratio of the number of atoms of the second element to the total number of Al and Sc atoms in the piezoelectric thin film 23, which is expressed in atomic composition percentage (at %). As shown in the table, ScAlN films were formed as piezoelectric thin films in Comparative Examples 1 to 8. The piezoelectric thin films of Comparative Examples 1 to 8 have different Sc composition ratios. These piezoelectric thin films were not doped with the second element. This means that in Comparative Examples 1 to 8, the Sc composition ratio is changed in the range of 0.03 to 0.55.

The results in the table of FIG. 6 have demonstrated that the stress tends to increase with increasing Sc composition ratio, and the piezoelectric constant tends to increase as the stress increases.

On the other hand, the piezoelectric thin films of Examples 1 to 7 were doped with W as the second element having an ionic radius smaller than that of Sc and larger than that of Al, while the Sc composition ratio was increased as in Comparative Examples 1 to 7. The content of W was set to 0.50 at %. The content has the same meaning as defined above. This means that, for example, in Example 1, the Sc composition ratio is 0.03 and the content of W is 0.50 at %. The results in the table of FIG. 6 show that the stress in the piezoelectric thin films of Examples 1 to 7 is lower than that in those of Comparative Examples 1 to 7 while the piezoelectric constant of the piezoelectric thin films of Examples 1 to 7 is higher than that of those of Comparative Examples 1 to 7. The results of Examples 1 to 7 show that the doping with the second element W simultaneously allowed a reduction in the stress and an increase in the piezoelectric constant.

In Comparative Example 9, a piezoelectric thin film was formed by doping the thin film of Comparative Example 8 with W as the second element. The results show that the piezoelectric constant of the piezoelectric thin film of Comparative Example 9 was 0 though the stress in the piezoelectric thin film of Comparative Example 9 is lower than that in the piezoelectric thin film of Comparative Example 8. It has been found from the results that the Sc composition ratio should preferably be set to at least 0.03 (Example 1) and at most 0.50 (Example 7).

In Examples 8 to 13, piezoelectric thin films were formed containing Zr, Ta, Ti, Cr, Ni, and Fe, respectively, as the second element. In Examples 8 to 13, the Sc composition ratio was set to 0.40, and the content of the second element was set to 0.50 at %. The results show that the stress is lower and the piezoelectric constant is higher in all of Examples 8 to 13 than in Comparative Example 6 where the Sc composition ratio is 0.40. It has been found from the results of Examples 8 to 13 that the doping with Zr, Ta, Ti, Cr, Ni, or Fe as the second element simultaneously allows a reduction in the stress and an increase in the piezoelectric constant.

In Examples 14 to 21, piezoelectric thin films were formed containing Fe as the second element. In Examples 14 to 21, the Sc composition ratio was set to 0.40, and the content of atoms of the second element was set to at least 0.005 at % (Example 14) and at most 1.10 at % (Example 21). The results show that the stress is lower and the piezoelectric constant is higher in all of Examples 14 to 21 than in Comparative Example 6 where the Sc composition ratio is 0.40. It has also been found that as the content of the second element is increased, the stress can be reduced while the piezoelectric constant is kept high.

In this regard, however, the table of FIG. 6 shows that the piezoelectric constant is relatively significantly lower in Example 21 where the content of the second element is set to 1.10 at % than in Example 20 where the content of the second element is set to 1.00 at %. In addition, the stress is only slightly lower in Example 14 where the content of the second element is set to 0.005 at % than in Comparative Example 6 where the Sc composition ratio is 0.40. It has been concluded from these results that the content of the second element in the piezoelectric thin film is preferably from 0.005 at % to 1.10 at %, more preferably from 0.01 at % to 1.00 at %.

It has also been found that when the second element exists as a trivalent cation as in Examples 9 to 21, the stress tends to decrease significantly and the piezoelectric constant tends to increase significantly. These results show that the second element is particularly effective when existing as a trivalent cation. It has also been found that the second element is particularly effective when having a coordination number of 4 or 6 as in Examples 1 to 21. It has been concluded from the above that the second element is particularly effective when the composition ratio of the first element and the content, valence, and coordination number of the second element are set within the value ranges shown above.

Figure 7:
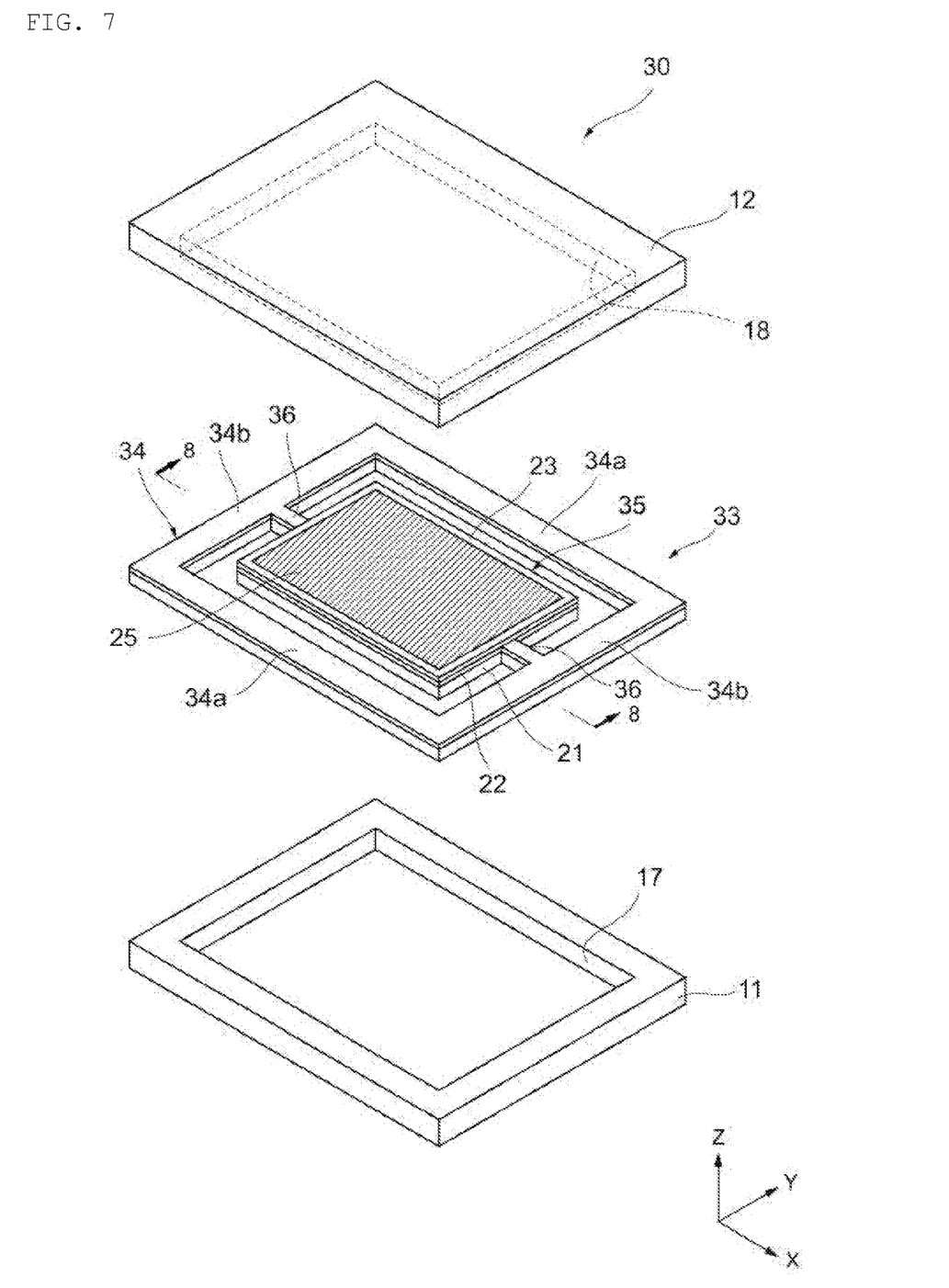
FIG. 7 is an exploded perspective view schematically illustrating the outer structure of a piezoelectric vibration device according to another embodiment.

FIG. 7 is an exploded perspective view schematically illustrating the outer structure of a piezoelectric vibration device 30 according to another embodiment. The piezoelectric vibration device 30 has a piezoelectric vibrator 33 configured to vibrate in an in-plane vibration mode, instead of the piezoelectric vibrator 13 configured to vibrate in the bending vibration mode as described above. Similarly to the piezoelectric vibrator 13 described above, the piezoelectric vibrator 33 is disposed between lower and upper substrates 11 and 12. The lower and upper substrates 11 and 12 have the same features as those described above, and therefore a duplicated description thereof will be omitted.

The piezoelectric vibrator 33 includes a supporting frame 34 extending in the form of a rectangular frame along the XY plane of the rectangular coordinate system in FIG. 7, a vibration portion 35 disposed inside the supporting frame 34 and extending in a rectangular shape along the XY plane like the supporting frame 34, and a pair of connecting portions 36 and 36 that connect the supporting frame 34 and the vibration portion 35 to each other. As described below, the vibration portion 35 vibrates by repeatedly expanding and contracting in the Y axis direction along the XY plane.

The supporting frame 34 includes a pair of long frame sides 34a and 34a extending parallel to the X axis and a pair of short frame sides 34b and 34b extending parallel to the Y axis and each having both ends connected to both ends of each of the long frame sides 34a and 34a. In this embodiment, the connecting portions 36 and 36 extend on a straight line parallel to the X axis to connect the frame sides 34b and 34b and the vibration portion 35 to one another. The connecting portions 36 and 36 are located at the midpoint in the Y axis direction of the vibration portion 35, in other words, located at the central ends (nodes) in the vibration direction of the vibration portion 35.

Figure 8:
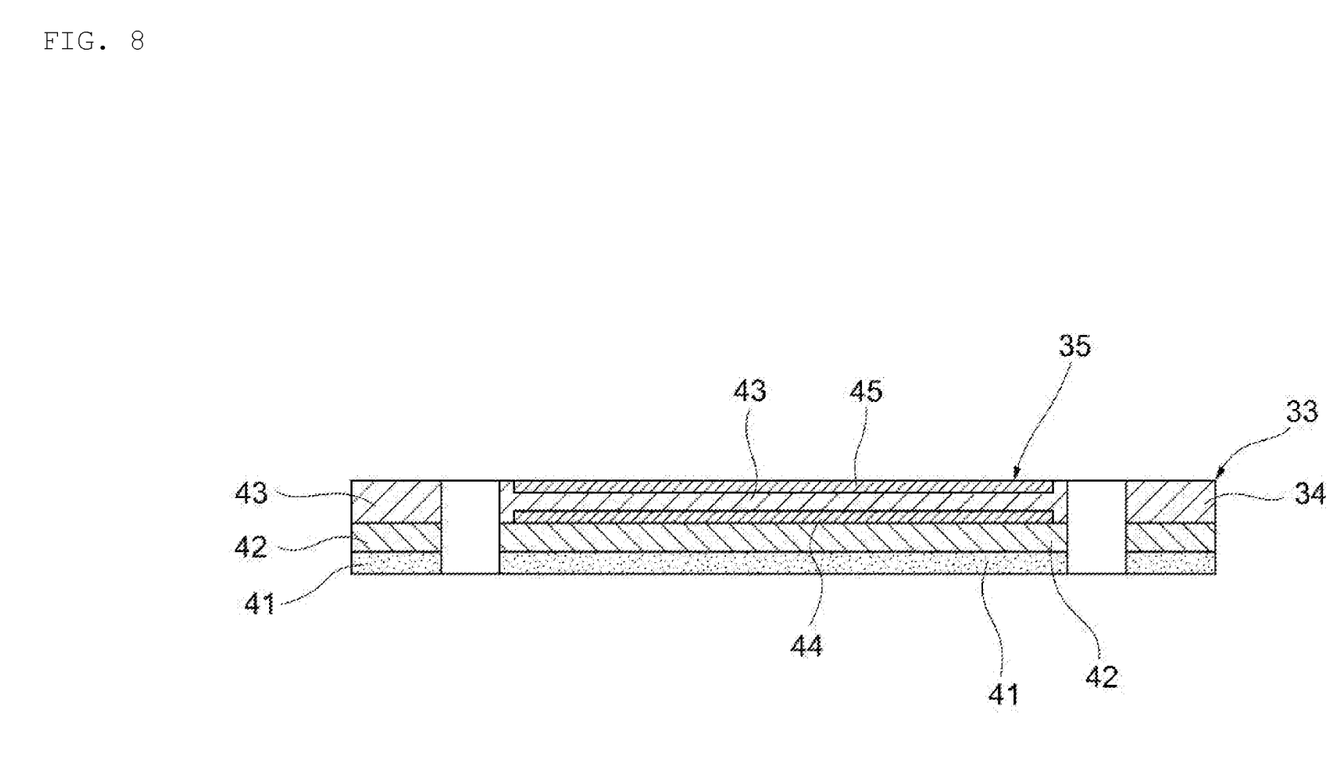
FIG. 8 is a schematic cross-sectional view of a piezoelectric vibrator along the line 8-8 in FIG. 7.

FIG. 8 is a schematic cross-sectional view along the line 8-8 in FIG. 7. As illustrated in FIG. 8, the supporting frame 34, the vibration portion 35, and the connecting portions 36 of the piezoelectric vibrator 33 include a silicon dioxide ($SiO_2$) layer 41, a Si layer 42 disposed on the $SiO_2$ layer 41, a piezoelectric thin film 43 disposed on the Si layer 42, and lower and upper electrodes 44 and 45 that are formed on the lower and upper surfaces of the piezoelectric thin film 43 to sandwich the piezoelectric thin film 43. The piezoelectric thin film 43 and the lower and upper electrodes 44 and 45 have the same features as those of the piezoelectric thin film 23 and the lower and upper electrodes 24 and 25 described above.

In the piezoelectric vibration device 30, the piezoelectric thin film 43 has the c axis oriented substantially perpendicular to the Si layer 42. The vibration portion 35 is driven to vibrate when an alternating electric field is applied substantially in the c axis direction between the lower and upper electrodes 44 and 45. Accordingly, the vibration portion 35 vibrates by expanding and contracting in the short-side direction, namely, in the Y axis direction. In other words, stretching vibration occurs, in which the vibration portion 35 repeatedly expands and contracts in the Y axis direction. The piezoelectric vibration apparatus 30 with these features can also bring about the same advantageous effects when the piezoelectric thin film 43 has the same features as those of the piezoelectric thin film 23 described above.

SECOND EMBODIMENT

In this embodiment, both a Group 2 element Mg (valence 2, coordination number 4, ionic radius 0.5 nm) and a Group 5 element Nb (valence 4, coordination number 8, ionic radius 0.79 nm) are selected as the first elements, and Fe (valence 3, coordination number 4, ionic radius 0.49 nm) is selected as the second element.

In this embodiment, the ratio of the number of Mg atoms to the total number of Al, Mg, and Nb atoms (hereinafter also referred to as the "Mg composition ratio") in the piezoelectric thin film 23 is set to 0.2, and the ratio of the number of Nb atoms to the total number of Al, Mg, and Nb atoms (hereinafter also referred to as the "Nb composition ratio") in the piezoelectric thin film 23 is also set to 0.2.

In addition, the percentage ratio of the number of atoms of the second element Fe to the total number of Al, Mg, and Nb atoms (hereinafter also referred to as the "content of the second element Fe") is preferably set to 0.005 at % to 1.10 at %, more preferably 0.005 at % to 1.00 at %. A detailed description will be given later for these value ranges.

The method used to verify the effects is the same as that in the first embodiment.

Figure 9:
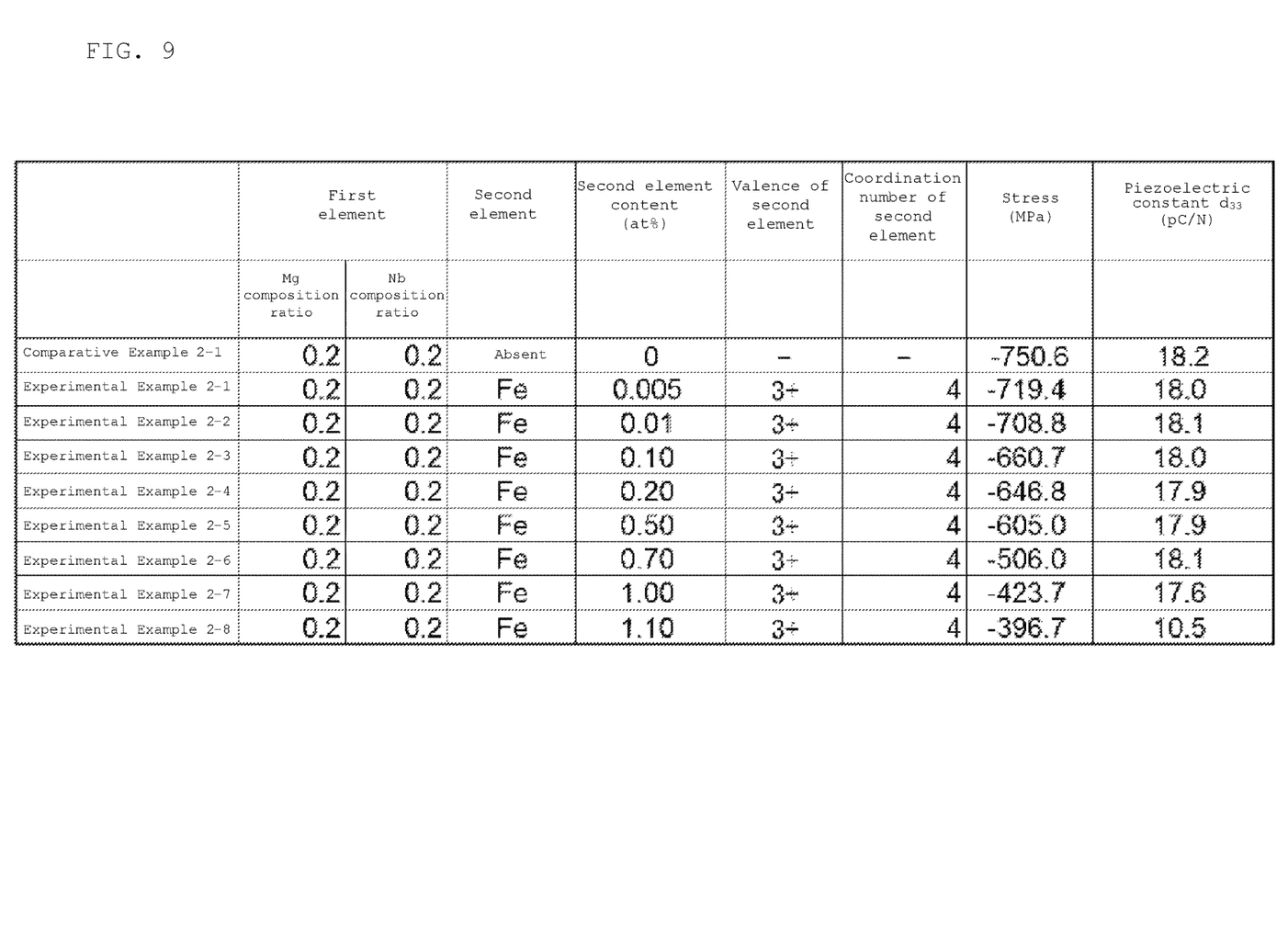
FIG. 9 is a table showing the results of verification of the effects of a second embodiment of the present invention, which corresponds to FIG. 6.

FIG. 9 is a table showing the results of the verification of the effects of this embodiment. As shown in the table of FIG. 9, when the piezoelectric thin film of Comparative Example 2-1 was formed, the Mg and Nb composition ratios were both set to 0.2, and doping with the second element was not performed. On the other hand, when the piezoelectric thin films of Experimental Examples 2-1 to 2-8 were formed, the Mg and Nb composition ratios were both set to 0.2, and the content of the second element Fe was set to at least 0.005 at % (Experimental Example 2-1) and at most 1.10 at % (Experimental Example 2-8).

As a result, the stress was successfully reduced while the piezoelectric constant was maintained in Experimental Examples 2-1 to 2-8 as compared with that in Comparative Example 2-1 where doping with Fe was not performed. In this regard, however, FIG. 9 shows that the piezoelectric constant is relatively significantly lower in Experimental Example 2-8 where the content of Fe is set to 1.10 at % than in Comparative Example 2-1 where doping with Fe is not performed, though the stress is successfully reduced in Experimental Example 2-8. Additionally, in Experimental Example 2-8, the stress is reduced by only a small amount from the stress in Comparative Example 2-7 where the content of Fe is set to 1.0 at %.

It has been concluded from these results that the content of Fe is preferably from 0.005 at % to 1.10 at %, more preferably from 0.005 at % to 1.00 at %, in the piezoelectric thin film where the Mg and Nb composition ratios are both 0.2.

Other effects and features are similar to those of the first embodiment.

THIRD EMBODIMENT

In this embodiment, both a Group 2 element Mg (valence 2, coordination number 4, ionic radius 0.5 nm) and a Group 5 element Hf (valence 4, coordination number 8, ionic radius 0.83 nm) are selected as the first elements, and Fe (valence 3, coordination number 4, ionic radius 0.49 nm) is selected as the second element.

In this embodiment, the ratio of the number of Mg atoms to the total number of Al, Mg, and Hf atoms (hereinafter also referred to as the "Mg composition ratio") in the piezoelectric thin film 23 is set to 0.25, and the ratio of the number of Hf atoms to the total number of Al, Mg, and Hf atoms (hereinafter also referred to as the "Hf composition ratio") in the piezoelectric thin film 23 is also set to 0.25.

In addition, the percentage ratio of the number of atoms of the second element Fe to the total number of Al, Mg, and Hf atoms (hereinafter also referred to as the "content of the second element Fe") is preferably set to 0.005 at % to 1.10 at %, more preferably 0.005 at % to 1.00 at %. A detailed description will be given later for these value ranges.

The method used to verify the effects is the same as that in the first embodiment.

Figure 10:
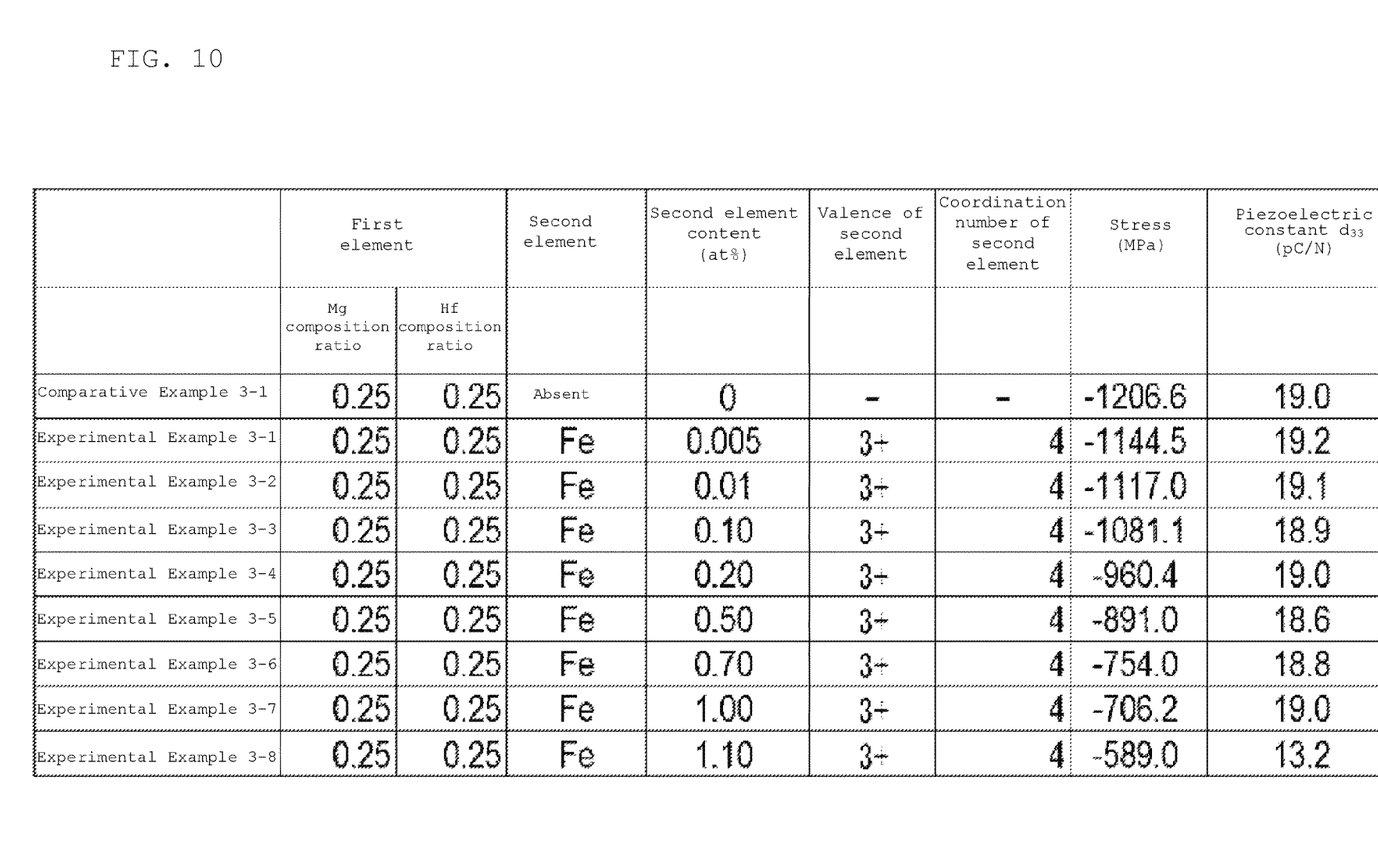
FIG. 10 is a table showing the results of verification of the effects of a third embodiment of the present invention, which corresponds to FIG. 6.

FIG. 10 is a table showing the results of the verification of the effects of this embodiment. As shown in the table of FIG. 10, when the piezoelectric thin film of Comparative Example 3-1 was formed, the Mg and Hf composition ratios were both set to 0.25, and doping with the second element was not performed. On the other hand, when the piezoelectric thin films of Experimental Examples 3-1 to 3-8 were formed, the Mg and Hf composition ratios were both set to 0.25, and the content of the second element Fe was set to at least 0.005 at % (Experimental Example 3-1) and at most 1.10 at % (Experimental Example 3-8).

As a result, the stress was successfully reduced while the piezoelectric constant was maintained in Experimental Examples 3-1 to 3-8 as compared with that in Comparative Example 3-1 where doping with Fe was not performed. In this regard, however, FIG. 10 shows that the piezoelectric constant is relatively significantly lower in Experimental Example 3-8 where the content of Fe is set to 1.10 at % than in Comparative Example 3-1 where doping with Fe is not performed, though the stress is successfully reduced in Experimental Example 3-8.

It has been concluded from these results that the content of Fe is preferably from 0.005 at % to 1.10 at %, more preferably from 0.005 at % to 1.00 at %, in the piezoelectric thin film where the Mg and Hf composition ratios are both 0.25.

Other effects and features are similar to those of the first embodiment.

It will be understood that each embodiment described above is only for easy understanding of the present invention and should not be construed as limiting the present invention. The present invention can be changed or modified without departing from the gist thereof and also encompasses equivalents thereof. In other words, one skilled in the art can appropriately make design changes to each embodiment, and the resulting modifications will also fall within the scope of the present invention as long as they have the features according to the present invention. For example, the location, material, conditions, shape, size, and other features of each element of each embodiment are not limited to those illustrated above and may be changed as appropriate. In addition, the respective elements of the respective embodiments can be combined in any technically feasible manner, and the resulting combinations will also fall within the scope of the present invention as long as they include the features according to the present invention.

DESCRIPTION OF REFERENCE SYMBOLS

13: Piezoelectric vibrator
23: Piezoelectric thin film
24: Electrode (lower electrode)
25: Electrode (upper electrode)
33: Piezoelectric vibrator
43: Piezoelectric thin film
44: Electrode (lower electrode)
45: Electrode (upper electrode)

The invention claimed is:

1. A piezoelectric film comprising:
   crystalline AlN;
   at least one first element partially replacing Al in the crystalline AlN; and
   a second element doping the crystalline AlN, the second element being a trivalent cation having a coordination number of 4 or 6, and having an ionic radius smaller than an ionic radius of the first element and larger than an ionic radius of Al.

2. The piezoelectric film according to claim 1, wherein the first element is Sc.

3. The piezoelectric film according to claim 2, wherein a ratio of a number of Sc atoms to a total number of Al and Sc atoms is 0.03 to 0.50 in the piezoelectric film.

4. The piezoelectric film according to claim 1, wherein the at least one first element comprises a Group 3 element, Group 2 and 4 elements, Group 2 and 5 elements, Group 12 and 4 elements, or Group 12 and 5 elements.

5. The piezoelectric film according to claim 1, wherein a percentage ratio of a number of atoms of the second element to a total number of Al atoms and atoms of the first element is 0.01 at % to 1.00 at %.

6. A piezoelectric vibrator comprising:
   a first electrode;
   a second electrode;
   a piezoelectric film between the first and second electrodes,
   the piezoelectric film comprising:
      crystalline AlN;
      at least one first element partially replacing Al in the crystalline AlN; and
      a second element doping the crystalline AlN, the second element being a trivalent cation having a coordination number of 4 or 6, and having an ionic radius smaller than an ionic radius of the first element and larger than an ionic radius of Al.

7. The piezoelectric vibrator according to claim 6, wherein the first element is Sc.

8. The piezoelectric vibrator according to claim 7, wherein a ratio of a number of Sc atoms to a total number of Al and Sc atoms is 0.03 to 0.50 in the piezoelectric film.

9. The piezoelectric vibrator according to claim 6, wherein the at least one first element comprises a Group 3 element, Group 2 and 4 elements, Group 2 and 5 elements, Group 12 and 4 elements, or Group 12 and 5 elements.

10. The piezoelectric vibrator according to claim 6, wherein a percentage ratio of a number of atoms of the second element to a total number of Al atoms and atoms of the first element is 0.01 at % to 1.00 at %.

* * * * *